(12) United States Patent
Wang et al.

(10) Patent No.: US 12,471,414 B2
(45) Date of Patent: Nov. 11, 2025

(54) LED CHIP AND PREPARATION METHOD THEREFOR

(71) Applicant: HUAIAN AUCKSUN OPTOELECTRONICS TECHNOLOGY CO., LTD, Jiangsu (CN)

(72) Inventors: Sibo Wang, Jiangsu (CN); Dongmei Li, Jiangsu (CN); Han-Chung Liao, Jiangsu (CN)

(73) Assignee: HUAIAN AUCKSUN OPTOELECTRONICS TECHNOLOGY CO., LTD, Jiangsu (CN)

( * ) Notice: Subject to any disclaimer, the term of this patent is extended or adjusted under 35 U.S.C. 154(b) by 103 days.

(21) Appl. No.: 18/256,173

(22) PCT Filed: Dec. 15, 2021

(86) PCT No.: PCT/CN2021/138501
§ 371 (c)(1),
(2) Date: Jun. 6, 2023

(87) PCT Pub. No.: WO2023/060753
PCT Pub. Date: Apr. 20, 2023

(65) Prior Publication Data
US 2024/0038936 A1 Feb. 1, 2024

(30) Foreign Application Priority Data

Oct. 14, 2021 (CN) ............................ 202111198536.5
Oct. 14, 2021 (CN) ............................ 202122479725.1

(51) Int. Cl.
*H10H 20/831* (2025.01)
*H01L 25/075* (2006.01)
(Continued)

(52) U.S. Cl.
CPC ..... *H10H 20/8312* (2025.01); *H01L 25/0753* (2013.01); *H10H 20/8162* (2025.01);
(Continued)

(58) Field of Classification Search
CPC .................. H01L 25/0753; H10H 20/032; H10H 20/034; H10H 20/0364; H10H 20/8162;
(Continued)

(56) References Cited

U.S. PATENT DOCUMENTS

2018/0040767 A1* 2/2018 Jang ................... H10H 20/814
2018/0145227 A1* 5/2018 Totani ................... H10H 20/84
(Continued)

*Primary Examiner* — Matthew C Landau
*Assistant Examiner* — Dmitriy Yemelyanov
(74) *Attorney, Agent, or Firm* — IP & T GROUP LLP

(57) ABSTRACT

The present disclosure relates to the technical field of semiconductor manufacturing, and in particular to an LED chip and a preparation method thereof, including: a substrate, an epitaxial layer, a current blocking layer, a current spreading layer, a first P-type electrode, a first N-type electrode, a first insulation layer, a second P-type electrode, a second N-type electrode, a second insulation layer, a third P-type electrode, a third N-type electrode, a P-type pad and a N-type pad. As for the LED chip, the electrode design of the flip chip is improved and a third N-type electrode and a third P-type electrode are added. The third N-type electrode and the P-type pad have no overlap spatially, similarly, the third P-type electrode and the N-type pad have no overlap spatially.

15 Claims, 3 Drawing Sheets

(51) Int. Cl.
*H10H 20/01* (2025.01)
*H10H 20/816* (2025.01)
*H10H 20/841* (2025.01)
*H10H 20/857* (2025.01)

(52) U.S. Cl.
CPC ........ *H10H 20/841* (2025.01); *H10H 20/857* (2025.01); *H10H 20/032* (2025.01); *H10H 20/034* (2025.01); *H10H 20/0364* (2025.01)

(58) Field of Classification Search
CPC ........... H10H 20/8312; H10H 20/8314; H10H 20/8316; H10H 20/84; H10H 20/841; H10H 20/857
See application file for complete search history.

(56) References Cited

U.S. PATENT DOCUMENTS

2019/0051797 A1\* 2/2019 Sung .................. H10H 20/8252
2019/0067511 A1\* 2/2019 Totani ................. H10H 20/857

\* cited by examiner

LED CHIP AND PREPARATION METHOD THEREFOR

CROSS-REFERENCE TO RELATED APPLICATION

The present disclosure is a national stage application of PCT/CN2021/138501 filed on Dec. 15, 2021, which claims the priority to the Chinese patent application with the filing No. 2021111985365, and entitled "LED Chip and Preparation Method Therefor", and the Chinese patent application with the filing No. 2021224797251, and entitled "LED Chip", filed with the Chinese Patent Office on Oct. 14, 2021, the entire contents of which are incorporated herein by reference.

TECHNICAL FIELD

The present disclosure relates to the technical field of semiconductor manufacturing, in particular to an LED chip and a preparation method therefor.

BACKGROUND ART

As a new generation of light source, LED is widely used in technical fields such as illuminating, display, backlight and even optical communication. As a product with higher light efficiency, flip chip has gotten more favored from users. The manufacturing process of flip chip has more structures, and the technological process is complicated, so there are higher requirements and challenges for reliability.

In the conventional ODR structure, as shown in FIG. 1, the metal layer of the P-type metal electrode extends to the bottom of the N-type pad, and these two are isolated from each other by the $SiO_2$ insulation layer to form the region shown in the dotted block. When the insulation layer breaks or cracks due to some reasons, in consequence, the P-type electrode and the N-type pad may be connected, and electric leakage may happen, thereby reducing the reliability of the existing LED during use.

SUMMARY

In view of this, the first object of the present disclosure is to provide an LED chip, which can avoid the problem of chip failure caused by electromigration of solder paste or breakage of the insulation layer compared with the conventional to ODR structure, by improving the electrode design of the flip chip and adopting double-layer homogeneous electrodes, thereby improving the reliability of the chip.

The second object of the present disclosure is to provide the preparation method of the above-mentioned LED chip. This method adds the third N-type electrode and the third P-type electrode, wherein the third N-type electrode and the P-type pad have no overlap spatially, and the third P-type electrode and the N-type pad also have no overlap spatially, such that there is no possibility of contact between these two, and there is no possibility of the problems of electric leakage and failure because of the interconnection of P-type and N-type electrodes with different polarities due to the breakage of the insulation layer in any case.

In order to achieve the above-mentioned purpose of the present disclosure, the following technical solutions are specially adopted.

The present disclosure provides an LED chip, which includes:
a substrate;
an epitaxial wafer with a PN step, wherein the epitaxial wafer includes an N-type semiconductive layer, a light-emitting layer and a P-type semiconductive layer;
at least one first P-type electrode, located on the PN step and in electrical connection with the P-type semiconductive layer;
at least one first N-type electrode, located on the N-type semiconductive layer and in electrical connection with the N-type semiconductive layer;
a first insulation layer, covering the first N-type electrode, the PN step, the first P-type electrode and the N-type semiconductive layer and provided with a plurality of first through holes and a plurality of second through holes;
a second P-type electrode, disposed on the first insulation layer and in electrical connection with the first P-type electrode through the first through hole;
a second N-type electrode, disposed on the first insulation layer and in electrical connection with the first N-type electrode through the second through hole;
a second insulation layer, covering the second P-type electrode, the second N-type electrode and the first insulation layer and provided with a plurality of third through holes and a plurality of fourth through holes;
a third P-type electrode, disposed on the second insulation layer and in electrical connection with the second P-type electrode through the third through hole;
a third N-type electrode, disposed on the second insulation layer and in electrical connection with the second N-type electrode through the fourth through hole;
a P-type pad, disposed on the third P-type electrode and in electrical connection with the third P-type electrode; and
a N-type pad, disposed on the third N-type electrode and in electrical connection with the third N-type electrode.

In an embodiment of the present disclosure, at least the third N-type electrode is disposed between the N-type pad and the second P-type electrode in the direction of the vertically sectional view; and/or,
at least the third P-type electrode is disposed between the P-type pad and the second N-type electrode.

In an embodiment of the present disclosure, the second layer directly below the N-type pad is a second insulation layer and/or a second N-type electrode.

Further, the projection of the N-type pad on the horizontal plane is located within the projection of the third N-type electrode on the horizontal plane.

In an embodiment of the present disclosure, the LED chip further includes a third insulation layer, and the third insulation layer covers the third P-type electrode and the third N-type electrode;
a plurality of fifth through holes and a plurality of sixth through holes are provided on the third insulation layer; and
the P-type pad is electrically connected to the third P-type electrode through the fifth through hole, and the N-type pad is electrically connected to the third N-type electrode through the sixth through hole.

In one embodiment of the present disclosure, the distance between the third P-type electrode and the third N-type electrode is greater than 15 µm; and/or the sum of the areas of the third P-type electrode and the third N-type electrode accounts for 50%-75% of the area of the entire LED chip; and/or the sum of the areas of the P-type pad and the N-type pad accounts for 30%-55% of the area of the entire LED chip.

In an embodiment of the present disclosure, the shortest distance between a region of the second P-type electrode and the side of the PN step is $D_1$, the shortest distance between the third N-type electrode and the side of the PN step is $D_2$, and the shortest distance between the N-type pad and the side of the PN step is $D_3$, and $D_1<D_2<D_3$; and further, $D_1>5$ μm, $D_2>8$ μm, and $D_3>15$ μm.

In an embodiment of the present disclosure, the plurality of first P-type electrodes are disposed on the PN step at intervals; and the plurality of first N-type electrodes are disposed on the N-type semiconductive layer at intervals.

In an embodiment of the present disclosure, there is a gap between one or more of the second N-type electrodes and the second P-type electrodes, respectively, wherein some of the second N-type electrodes are located on the PN step.

In an embodiment of the present disclosure, the first insulation layer is a DBR reflective layer made of silicon oxide;

further, the thickness of the first insulation layer is between 2 μm and 7 μm, and further, the thickness is between 3.5 μm and 5.5 μm.

In an embodiment of the present disclosure, the second insulation layer and/or the third insulation layer include at least one of silicon oxide, silicon nitride, and silicon oxynitride;

further, the thickness of the second insulation layer and/or the third insulation layer is between 1 KÅ and 20 KÅ.

The preparation method of the LED chip provided by the present disclosure includes the following steps:

(a) providing a substrate, and sequentially depositing an N-type semiconductive layer, a light-emitting layer and a P-type semiconductive layer on the substrate to form an epitaxial layer;

(b) depositing $SiO_2$ on the epitaxial layer, and obtaining a current blocking layer by photolithography, then depositing to obtain a current spreading layer, and obtaining a PN step by etching;

(c) depositing a plurality of first P-type electrodes and a plurality of first N-type electrodes on the surface of the chip, wherein the plurality of first P-type electrodes and the plurality of first N-type electrodes are alternately distributed, and then depositing a first insulation layer;

(d) obtaining a first through hole and a second through hole by photolithography above the first P-type electrode and the first N-type electrode, respectively, depositing a second P-type electrode at the first through hole, and depositing a second N-type electrode at the second through hole, wherein the second P-type electrode and the second N-type electrode are isolated from each other;

(e) depositing a second insulation layer, and obtaining a third through hole and a fourth through hole above the second P-type electrode and the second N-type electrode respectively by photolithography, depositing a third P-type electrode at the third through hole, and depositing a third N-type electrode at the fourth through hole, wherein the third P-type electrode and the third N-type electrode are isolated from each other, and the second P-type electrode extends below the third N-type electrode; and (f) depositing a third insulation layer, and obtaining a fifth through hole and a sixth through hole above the third P-type electrode and the third N-type electrode respectively by photolithography, depositing a P-type pad at the fifth through hole, and depositing an N-type pad at the sixth through hole.

Compared with the prior art, the beneficial effects of the present disclosure are as follows.

The present disclosure relates to an LED chip, compared with the conventional ODR structure, the electrode design of the flip chip is improved and a third N-type electrode and a third P-type electrode are added. The third N-type electrode and the P-type pad have no overlap spatially, similarly, the third P-type electrode and the N-type pad have no overlap spatially, so that there is no possibility of contact between these two, and there is no possibility of the problems of electric leakage and failure because of the interconnection of P-type and N-type electrodes with different polarities due to the breakage of silicon oxide for any reason, thereby improving the reliability of the chip.

BRIEF DESCRIPTION OF DRAWINGS

In order to illustrate the technical solutions of the embodiments of the present disclosure more clearly, the drawings used in the embodiments will be briefly introduced below. It should be understood that the following drawings only show some embodiments of the present disclosure, therefore should not be regarded as a limitation on the scope, and those of ordinary skill in the art can also obtain other related drawings based on these drawings without inventive effort.

REFERENCE NUMERALS

| 100-substrate; | 200-epitaxial layer; | 210-N-type semiconductive layer; |
|---|---|---|
| 211-PN step; | 220-light-emitting layer; | 230-P-type semiconductive layer; |
| 300-current blocking layer; | 400-current spreading layer; | 510-first P-type electrode; |
| 511-first through hole; | 520-first N-type electrode; | 521-second through hole; |
| 600-first insulation layer; | 710-second P-type electrode; | 711-third through hole; |
| 720-second N-type electrode; | 721-fourth through hole; | 800-second insulation layer; |
| 910-third P-type electrode; | 920-third N-type electrode; | 1000-NP pad set; |
| 1100-P-type pad; | 1200-N-type pad; | 1300-third insulation layer. |

DETAILED DESCRIPTION OF EMBODIMENTS

In order to make the purpose, technical solutions and advantages of the embodiments of the present disclosure clearer, the technical solutions in the embodiments of the present disclosure will be clearly and completely described below in conjunction with the drawings in the embodiments of the present disclosure. Obviously, the described embodiments are only a part of the embodiments of the present disclosure, not all of them. Generally, the components of the embodiments of the present disclosure described and illustrated in drawings herein may be arranged and designed in a variety of different configurations. Accordingly, the following detailed description of the embodiments of the present disclosure provided in drawings does not intend to limit the scope of the present disclosure claimed, but merely represents selected embodiments of the present disclosure. Based on the embodiments of the present disclosure, all other embodiments obtained by those ordinarily skilled in the art without inventive effort shall fall within the protection scope of the present disclosure.

Figure 1:
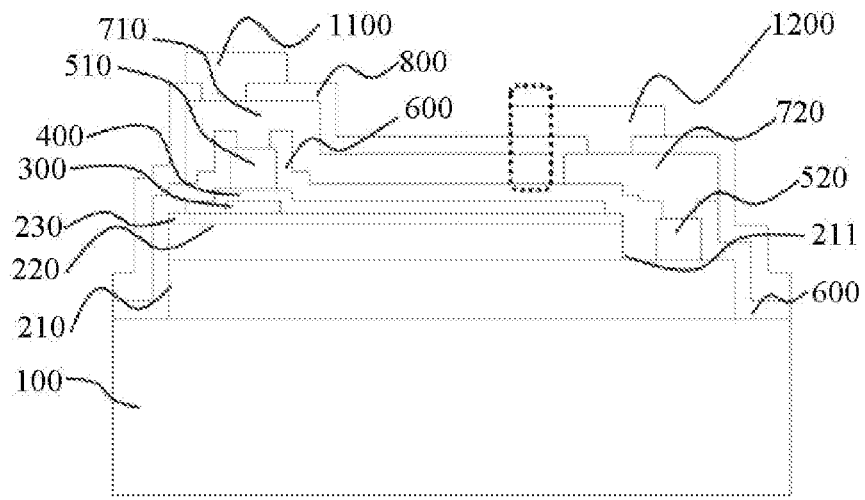
FIG. 1 is a sectional view of a flip LED chip in the existing ODR structure.
Figure 2:
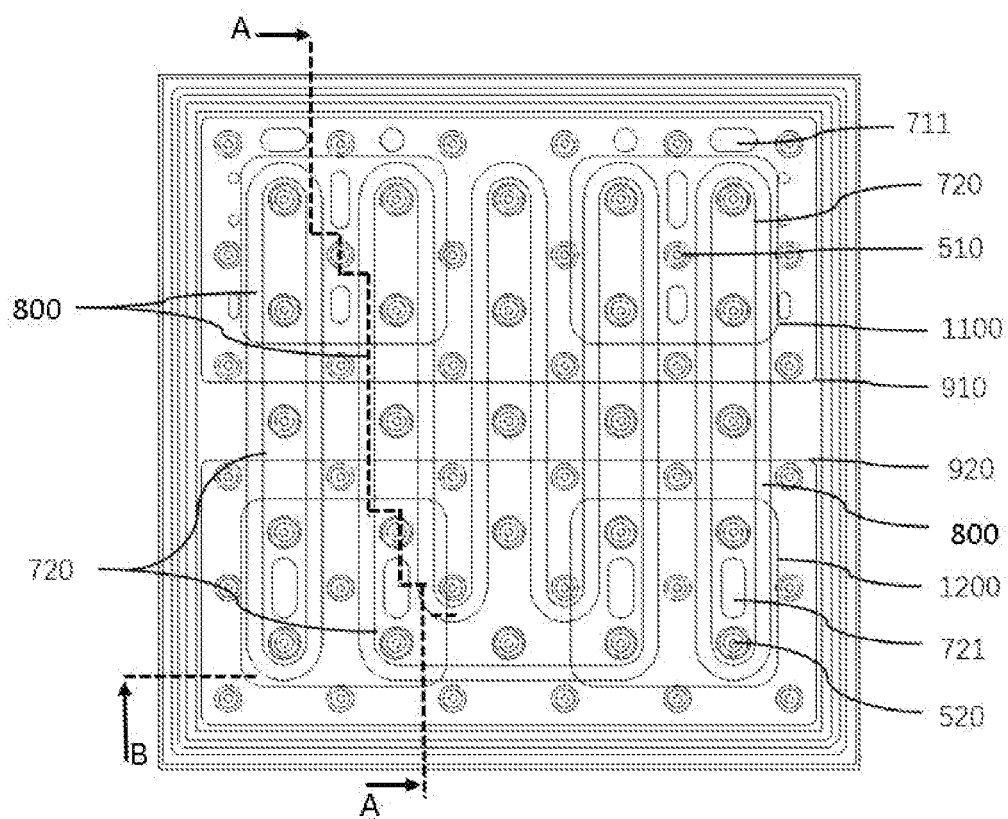
FIG. 2 is a planar structural schematic view of the LED chip provided by an embodiment of the present disclosure.
Figure 3:
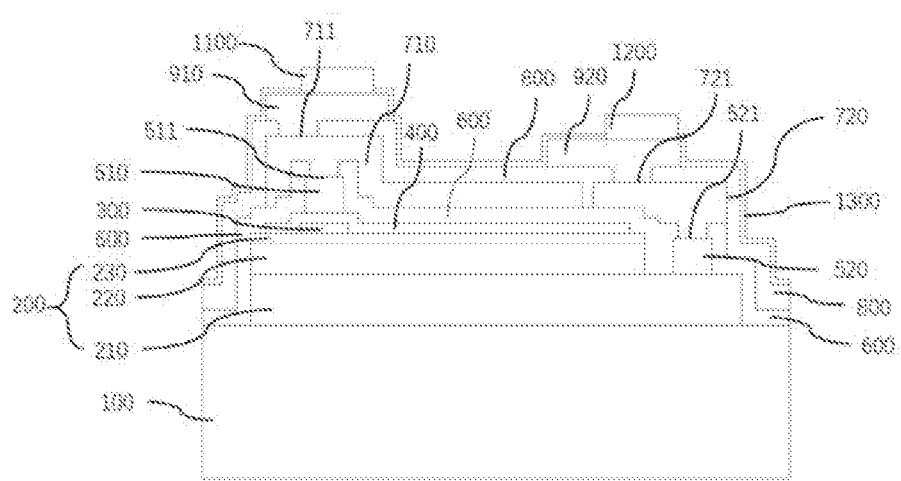
FIG. 3 is a sectional view of the LED chip cut along the way A in FIG. 2 provided by the embodiment of the present disclosure.
Figure 4:
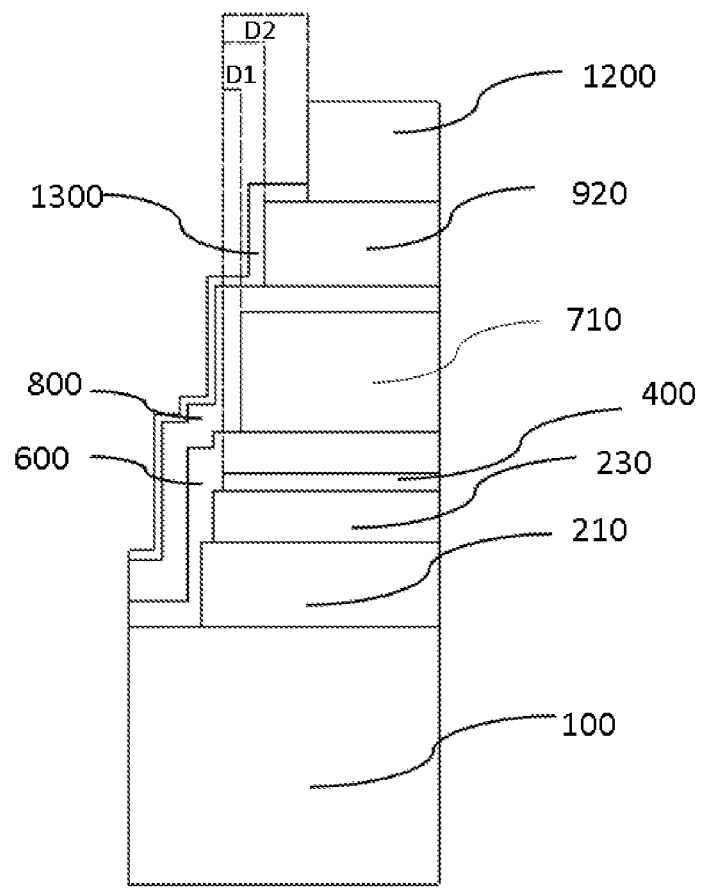
FIG. 4 is a sectional view of the LED chip cut along the way B in FIG. 2 provided by the embodiment of the present disclosure.

FIG. 2 is a planar structural schematic view of the LED chip provided by the embodiment of the present disclosure; FIG. 3 is a sectional view of the LED chip cut along the way A in FIG. 2 provided by the embodiment of the present disclosure; and FIG. 4 is a sectional view of the LED chip cut along the way B in FIG. 2 provided by the embodiment of the present disclosure. As shown in FIG. 2 and FIG. 3, the LED chip provided by the embodiment of the present disclosure includes:

a substrate 100;

the epitaxial wafer with a PN step 211, wherein the epitaxial wafer includes an N-type semiconductive layer 210, a light-emitting layer 220 and a P-type semiconductive layer 230;

at least one first P-type electrode 510, located on the PN step 211 and in electrical connection with the P-type semiconductive layer 230;

at least one first N-type electrode 520, located on the N-type semiconductive layer 210 and in electrical connection with the N-type semiconductive layer 210;

the first insulation layer 600, covering the first N-type electrode 520, the PN step 211, the first P-type electrode 510 and the N-type semiconductive layer to 210, and provided with a plurality of first through holes 511 and a plurality of second through holes 521;

the second P-type electrodes 710, disposed on the first insulation layer 600 and in electrical connection with the first P-type electrode 510 through the first through holes 511;

the second N-type electrodes 720, disposed on the first insulation layer 600 and in electrical connection with the first N-type electrode 520 through the second through holes 521;

the second insulation layer 800, covering the second P-type electrodes 710, the second N-type electrodes 720 and the first insulation layer 600 and provided with a plurality of third through holes 711 and a plurality of fourth through holes 721;

the third P-type electrodes 910, disposed on the second insulation layer 800 and in electrical connection with the second P-type electrodes 710 through the third through holes 711;

the third N-type electrodes 920, disposed on the second insulation layer 800 and in electrical connection with the second N-type electrodes 720 through the fourth through holes 721;

the P-type pads 1100, disposed on the third P-type electrodes 910 and in electrical connection with the third P-type electrodes 910; and the N-type pads 1200, disposed on the third N-type electrodes 920 and in electrical connection with the third N-type electrodes 920.

In the above, the epitaxial layer 200 includes a PN step 211, the upper step surface of the PN step 211 is the P-type semiconductive layer 230, the lower step surface is the N-type semiconductive layer 210, and the upper step surface and the lower step surface are connected to form the side of the PN step 211.

In the process of designing the LED chip, the third N-type electrode 920 and the third P-type electrode 910 are added, and there is no overlap between the third N-type electrode 920 and the P-type pad 1100 in vertical space or in any other direction, similarly, there is no overlap between the third P-type electrode 910 and the N-type pad 1200 in the vertical space or in any other direction, such that there is no possibility of contact between these two, and there is no possibility of the problems of electric leakage and failure because of the interconnection of P-type and N-type electrodes with different polarities due to the rupture of insulation layer for any reason, thereby improving the reliability of the chip.

Further, the substrate 100 may be a sapphire substrate 100, but is not limited thereto. In addition, a patterned substrate 100 may also be selected.

Further, the material of the N-type semiconductive layer 210 may be N-type doped gallium nitride, and the material of the P-type semiconductive layer 230 to may be P-type doped gallium nitride, but are not limited to these two semiconductors type.

Further, the light-emitting layer 220 includes alternately stacked quantum wells and quantum barriers, but is not limited thereto. The light-emitting layer 220 includes but is not limited to a red-light light-emitting layer 220, a yellow-light light-emitting layer 220, a green-light light-emitting layer 220 or a blue-light light-emitting layer 220. The quantum wells include but are not limited to InGaN quantum wells or AlInGaN quantum wells.

Further, the current blocking layer 300 includes but is not limited to $SiO_2$.

Further, the current spreading layer 400 includes but is not limited to one of ITO, ZITO, ZIO, GIO, ZTO, FTO, AZO and GZO.

Further, the thickness of the current spreading layer 400 ranges from 150 Å to 2000 Å, such as 150 Å, 200 Å, 300 Å, 500 Å, 800 Å, 1000 Å, 1500 Å, 1600 Å, 1800 Å, and 2000 Å. Furthermore, the current spreading layer 400 can be obtained by depositing via magnetron sputtering or evaporation.

In an embodiment of the present disclosure, the current spreading layer 400 occupies 70%-90% of the area of the LED chip.

Further, according to the topography of the photoresist formed based on the pattern, the plurality of first P-type electrodes 510 and the plurality of first N-type electrodes 520 are deposited on the surface of the chip, and the first P-type electrodes and the first N-type electrodes 520 may be a finger-shaped electrode (Finger electrode). Moreover, the first P-type electrode 510 and the first N-type electrode 520 are isolated from each other, which have an isolation groove. Further, the electrode structure of the first P-type electrode 510 and the first N-type electrode 520 may be the electrode structures of metals such as Cr/Al/Ti/Ni/Pt/Au, and can be a single metal layer or a composite layer of several metals.

In an embodiment of the present disclosure, in order to improve the using stability of the LED chip, it is ensured that the second electrode with the same polarity as the pad layer must be sandwiched between the second electrode layer and the pad layer, such that there is no possibility that the second electrode layer contacts the pad layer. Specifically, at least a third N-type electrode 920 is disposed between the N-type pad 1200 and the second P-type electrode 710; and/or at least the third P-type electrode 910 is disposed between the P-type pad 1100 and the second N-type electrode 720. Furthermore, the second layer directly under the N-type pad is the second insulation layer 800 and/or the second N-type electrode 720.

Further, the projection of the N-type pad on the horizontal plane is located within the projection of the third N-type electrode 920 on the horizontal plane, so as to ensure that there is no overlap spatially between the third N-type electrode 920 and the P-type pad 1100. Similarly, the third P-type electrode 910 and the N-type pad 1200 do not have any overlap spatially, such that there is no possibility of contact between these two, and there is no possibility of the problems of electric leakage and failure because of the interconnection of P-type and N-type electrodes with different polarities due to the fracture of silicon oxide for any reason, thereby improving the reliability of the chip.

In an embodiment of the present disclosure, an insulation layer can be further coated outside the third electrode layer. The LED chip further includes the third insulation layer 1300, the third insulation layer 1300 covers the third P-type electrode 910 and the third N-type electrode 920; the third insulation layer 1300 is provided with a plurality of fifth through holes and sixth through holes; and the P-type pad 1100 is electrically connected to the third P-type electrode 910 through the fifth through hole, and the N-type pad 1200 is electrically connected to the third N-type electrode 920 through the sixth through hole.

In an embodiment of the present disclosure, there is a gap between one or more of the second N-type electrodes 720 and the second P-type electrodes 710, respectively, wherein a part of the second N-type electrodes 720 are located on the PN step 211.

Figure 5:
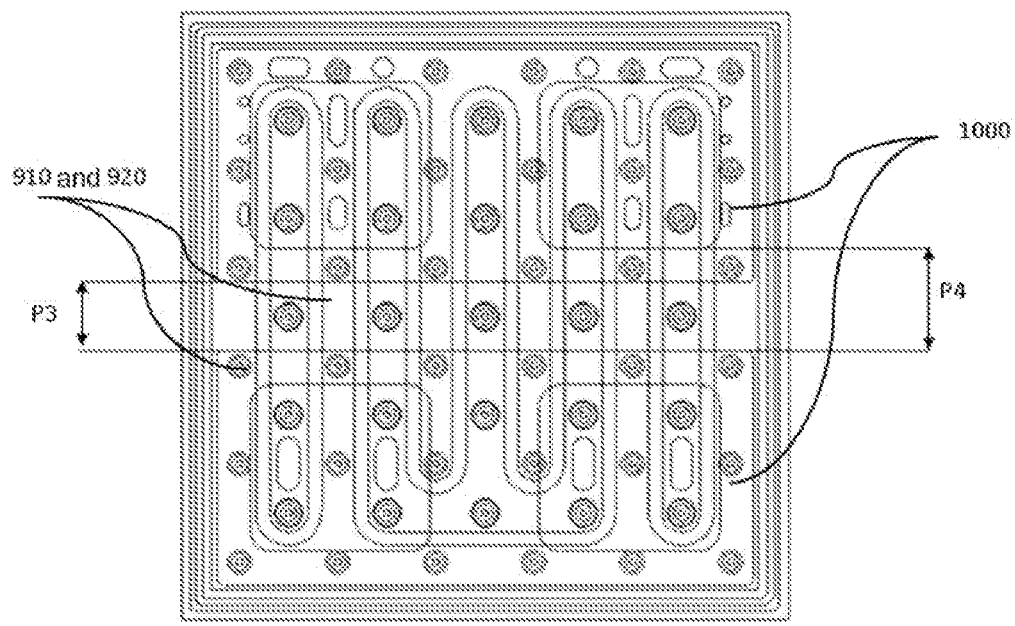
FIG. 5 is a schematic view of the distances between the third P-type electrode, the third N-type electrode, the fourth P-type electrode, and the fourth N-type electrode of the LED chip provided by the embodiment of the present disclosure.

In an embodiment of the present disclosure, as P3 shown in FIG. 5, the distance between the third P-type electrode 910 and the third N-type electrode 920 is greater than 15 μm;
the sum of the areas of the third P-type electrode 910 and the third N-type electrode 920 accounts for from 50% to 75% of the area of the entire LED chip, such as 50%, 60%, 70% and 75%; and
the sum of the areas of the P-type pad 1100 and the N-type pad 1200 accounts for from 30% to 55% of the area of the entire LED chip, such as 30%, 40%, 45% and 55%.

In an embodiment of the present disclosure, the shortest distance between the region of the second P-type electrode 710 and the side of the PN step 211 is $D_1$, the shortest distance between the third N-type electrode 920 and the side of the PN step 211 is $D_2$, and the shortest distance between the N-type pad 1200 and the side of the PN step 211 is $D_3$, wherein $D_1 < D_2 < D_3$.

Further, $D_1 > 5$ μm, $D_2 > 8$ μm, and $D_3 > 15$ μm.

Further, the plurality of first P-type electrodes 510 are arranged on the PN step 211 at intervals; the plurality of first N-type electrodes 520 are arranged at intervals on the N-type semiconductive layer 210. Furthermore, there are one or more second N-electrode regions, and there are gaps between the second N-electrode regions and the second P-electrode region, respectively, wherein a part of the second N-electrode regions is located on the PN step 211.

In an embodiment of the present disclosure, the first insulation layer 600 is a DBR reflective layer made of silicon oxide.

Further, the DBR reflective layer includes but is not limited to any one or more of $SiO_2$, $TiO_2$ and $Ti_3O_5$, such as $SiO_2$ and/or $TiO_2$, or $SiO_2$ and/or $Ti_3O_5$. Furthermore, the DBR reflective layer may be formed by depositing $SiO_2$ and $Ti_3O_5$ alternately.

Further, the first through holes 511 that directly access to the first P-type electrodes 510 and the second through holes 521 that directly access to the first N-type electrodes 520 are obtained by etching on the DBR reflective layer. The second P-type electrode 710 is formed by electron beam evaporation at the first through hole 511, the second N-type electrode 720 is formed by electron beam evaporation at the second through hole 521. The second P-type electrode 710 and the second N-type electrode 720 form an ODR structure with the DBR reflective layer, so that the reflectivity of this layer of electrodes is between 60% and 95%, and the angle of metal electrodes of this layer is required to be 30° to 75°.

Further, the thickness of the first insulation layer 600 is 2 μm to 7 μm, such as 2 μm, 3 μm, 4 μm, 5 μm, 6 μm and 7 μm, and further, the thickness is between 3.5 μm and 5.5 μm.

In an embodiment of the present disclosure, the second insulation layer 800 and/or the third insulation layer 1300 include at least one of silicon oxide, silicon nitride, and silicon oxynitride, for example, silicon oxide and/or silicon nitride, or silicon nitride and/or silicon oxynitride.

Further, the thickness of the second insulation layer 800 and/or the third insulation layer 1300 is 1KÅ to 20KÅ, such as 1KÅ, 5KÅ, 10KÅ, 12KÅ, 15KÅ, to 18KÅ and 20KÅ.

Further, the P-type pad 1100 and the N-type pad 1200 may adopt one metal of Ti, Al, Pt, Ni and Au or a combination of several metal layers. Furthermore, the thickness of Al is between 5KÅ and 20KÅ, the thickness of Pt is between and 3KÅ, the thickness of Ti is between 0.5 and 3KÅ, the thickness of Ni is between 3KÅ and 12KÅ, and the thickness of Au is between 1 KÅ and 5KÅ.

Further, the P-type pad 1100 and the N-type pad 1200 may be Bump electrodes, and the composition of electrode is Sn. Furthermore, the Bump electrodes can be made by printing, electroplating, evaporation and other methods. The height of the Bump electrode is 5 μm, the height of the solder paste is 20 μm.

In an embodiment of the present disclosure, the sum of the areas of the third P-type electrode 910 and the third N-type electrode 920 accounts for from 50% to 75% of the area of the entire LED chip, such as 50%, 60%, 70% and 75%.

In an embodiment of the present disclosure, the sum of the areas of the P-type pad 1100 and the N-type pad 1200 accounts for from 30% to 55% of the area of the entire LED chip, such as 30%, 40%, 45% and 55%.

In an embodiment of the present disclosure, the sum of the areas of the third P-type electrode 910 and the third N-type electrode 920 is greater than the sum of the areas of the P-type pad 1100 and the N-type pad 1200.

The embodiment of the present disclosure also provides a specific to preparation method of the LED chip, including the following steps:
(1) providing a substrate 100, and sequentially preparing an N-type semiconductive layer 210, a light-emitting layer 220 and a P-type semiconductive layer 230 on the substrate 100 to form an epitaxial layer 200;
(2) depositing $SiO_2$ on the epitaxial layer 200, obtaining the current blocking layer 300 by yellow light and etching, then obtaining the current spreading layer 400 by depositing an ITO film with a thickness of 150 Å to 2000 Å via magnetron sputtering or evaporation, obtaining the PN step 211 by etching, and forming the isolation groove by deep etching;

(3) performing yellow light according to the pattern to form the photoresist morphology, depositing the first P-type electrodes 510 and the first N-type electrodes 520 on the surface of the chip, which are distributed alternately, and then depositing the first insulation layer 600;

(4) obtaining a first through hole 511 and a second through hole 521 respectively by photolithography above the first P-type electrode 510 and the first N-type electrode 520, and depositing the second P-type electrode 710 at the first through hole 511, wherein the first through hole 511 and the second through hole 521 are separated from each other without any extended crossing; depositing the second N-type electrode 720 at the second through hole 521, wherein the second P-type electrode 710 and the second N-type electrode 720 are isolated from each other, the second P-type electrode 710 communicates with the first P-type electrode 510 through the first through hole, and the second N-type electrode 720 communicates with the first N-type electrode 520 through the second through hole, thereby the reflectivity of the electrode is from 60% to 95%, and the metal electrode angle of this layer is required to be 30° to 75°;

(5) depositing the second insulation layer 800 with a thickness of 1KÅ to and obtaining the third through holes 711 and fourth through holes 721 respectively via yellow light and ICP dry etching above the second P-type electrodes 710 and the second N-type electrodes 720, depositing a third P-type electrode 910 at the third through hole 711, and depositing a third N-type electrode 920 at the fourth through hole 721, thereby the electrode reflectivity is between 60% and 95%, and in order to ensure the subsequent film coverage, the metal electrode angle of this layer is required to be 30° to 75°, wherein the third P-type electrode 910 and the third N-type electrode 920 are isolated from each other, the second P-type electrode 710 extends below the third N-type electrode 920, and except for the third through hole 711 and the fourth through hole 721, the remaining part of front chip of the second insulation layer 800 has no fracture, so as to ensure that the upper third N-type electrode 920 is separated from the lower second P-type electrode 710 extending below the third N-type electrode 920, thereby cutting off the leakage path;

(6) depositing the third insulation layer 1300, and obtaining the fifth through hole and the sixth through hole respectively above the third P-type electrode to 910 and the third N-type electrode 920 via photolithography, wherein the etching angle is required to be 20° to 80°, depositing a P-type pad 1100 at the fifth through hole, and depositing an N-type pad 1200 at the sixth through hole; and (7) performing grinding, scratching, etc. to form chiplets, wherein the grinding thickness ranges from 80 μm to 300 μm.

From this, a flip LED chip can be obtained. The P-type pad 1100 is interconnected with the third P-type electrode 910 through the fifth through hole of the third insulation layer 1300, and the N-type pad 1200 is interconnected with the third N-type electrode 920 through the sixth through hole of the third insulation layer 1300. At the same time, the surface of the fourth P-type pad 1100 facing the substrate 100 is only connected to the third P-type electrode 910, and the surface of the N-type pad 1200 facing the substrate 100 is only connected to the third N-type electrode 920. Viewed horizontally and vertically, no surface of the P-type pad 1100 is in direct or indirect contact with the third N-type electrode 920, and no extended crossing exists. The same applies to the N-type pad 1200 and the third P-type electrode 910. Therefore, there is no possibility of the problems of electric leakage and failure because of the interconnection of P-type and N-type electrodes with different polarities due to the fracture of silicon oxide for any reason.

Figure 6:
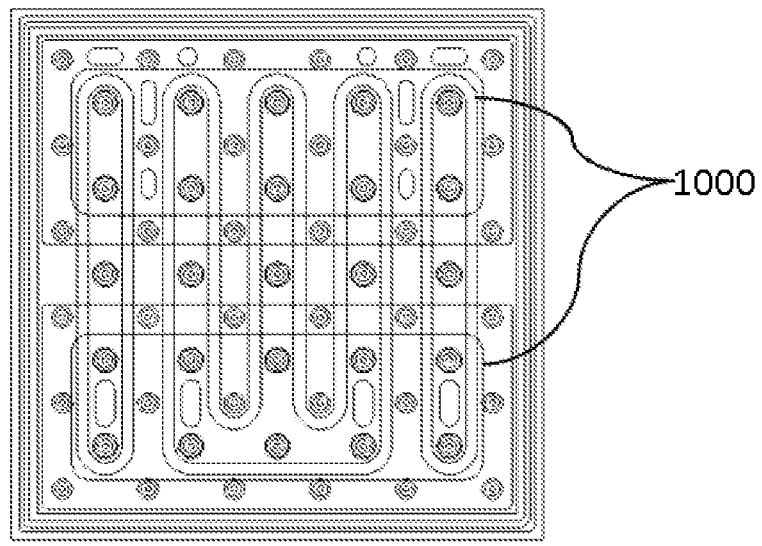
FIG. 6 is a planar structural schematic view of the LED chip provided by another embodiment of the present disclosure.

Another embodiment of the present disclosure also provides a specific method for preparing the LED chip. The structural schematic view of the prepared LED chip is shown in FIG. 6, the N-type pad 1200 and the P-type pad 1100 are in the form of two pads, respectively, as NP pad set 1000 shown in the figure, and the size of each pad is 688 μm*244 μm.

INDUSTRIAL APPLICABILITY

To sum up, the present disclosure provides an LED chip. The present disclosure improves the chip reliability by improving the electrode design of the flip chip and adopting double-layer homogeneous electrodes to avoid the problem of chip failure caused by electromigration of solder paste or breakage of the insulation layer.

What is claimed is:

1. An LED chip, wherein the LED chip comprises:
   a substrate;
   an epitaxial wafer with a PN step, wherein the epitaxial wafer comprises an N-type semiconductive layer, a light-emitting layer and a P-type semiconductive layer;
   at least one first P-type electrode, located on the PN step and in electrical connection with the P-type semiconductive layer;
   at least one first N-type electrode, located on the N-type semiconductive layer and in electrical connection with the N-type semiconductor layer;
   a first insulation layer, covering the first N-type electrode, the PN step, the first P-type electrode and the N-type semiconductive layer, and provided with a plurality of first through holes and a plurality of second through holes;
   second P-type electrodes, disposed on the first insulation layer and in electrical connection with the first P-type electrode through the first through holes;
   second N-type electrodes, disposed on the first insulation layer and in electrical connection with the first N-type electrode through the second through holes;
   a second insulation layer, covering the second P-type electrodes, the second N-type electrodes and the first insulation layer, and provided with a plurality of third through holes and a plurality of fourth through holes;
   third P-type electrodes, disposed on the second insulation layer and in electrical connection with the second P-type electrodes through the third through holes;
   third N-type electrodes, disposed on the second insulation layer, and in electrical connection with the second N-type electrodes through the fourth through holes;
   P-type pads, disposed on the third P-type electrodes and in electrical connection with the third P-type electrodes; and
   N-type pads, disposed on the third N-type electrodes and in electrical connection with the third N-type electrodes.

2. The LED chip according to claim 1, wherein at least the third N-type electrodes are arranged between the N-type pads and the second P-type electrodes in a direction of a vertically sectional view; and/or
   at least the third P-type electrodes are disposed between the P-type pads and the second N-type electrodes.

3. The LED chip according to claim 1, wherein a second layer directly under the N-type pads is the second insulation layer and/or the second N-type electrodes.

4. The LED chip according to claim 3, wherein a projection of the N-type pads on a horizontal plane is located within a projection of the third N-type electrodes on the horizontal plane.

5. The LED chip according to claim 1, wherein the LED chip further comprises a third insulation layer, and the third insulation layer covers the third P-type electrodes and the third N-type electrodes;
  a plurality of fifth through holes and sixth through holes are provided on the third insulation layer; and
  the P-type pads are electrically connected to the third P-type electrodes through the fifth through holes, and the N-type pads are electrically connected to the third N-type electrodes through the sixth through holes.

6. The LED chip according to claim 1, wherein a distance between the third P-type electrodes and the third N-type electrodes is greater than 15 μm; and/or
  a sum of areas of the third P-type electrodes and the third N-type electrodes accounts for 50%-75% of an area of the entire LED chip; and/or
  a sum of areas of the P-type pads and the N-type pads accounts for 30%-55% of the area of the entire LED chip.

7. The LED chip according to claim 1, wherein a shortest distance between a region of the second P-type electrodes and a side of the PN step is $D_1$, and a shortest distance between the third N-type electrodes and the side of the PN step is $D_2$, and a shortest distance between the N-type pads and the side of the PN step is $D_3$, wherein $D_1<D_2<D_3$.

8. The LED chip according to claim 7, wherein $D_1>5$ μm, $D_2>8$ μm, and $D_3>15$ μm.

9. The LED chip according to claim 1, wherein a plurality of the first P-type electrodes are arranged at intervals on the PN step; a plurality of the first N-type electrodes are arranged at intervals on the N-type semiconductive layer; and/or
  a gap exists between one or more of the second N-type electrodes and the second P-type electrodes, respectively, and some of the second N-type electrodes are located on the PN step.

10. The LED chip according to claim 1, wherein the first insulation layer is a DBR reflective layer made of silicon oxide.

11. The LED chip according to claim 1, wherein a thickness of the first insulation layer is 2 μm to 7 μm.

12. The LED chip according to claim 1, wherein a thickness of the first insulation layer is 3.5 μm to 5.5 μm.

13. The LED chip according to claim 5, wherein the second insulation layer and/or the third insulation layer comprise at least one of silicon oxide, silicon nitride and silicon oxynitride.

14. The LED chip according to claim 5, wherein a thickness of the second insulation layer and/or the third insulation layer is 1 KÅ to 20 KÅ.

15. A method for preparing the LED chip according to claim 1, comprising following steps:
  (a) providing the substrate, and sequentially depositing the N-type semiconductor layer, the light-emitting layer and the P-type semiconductive layer on the substrate to form an epitaxial layer;
  (b) depositing SiO2 on the epitaxial layer, obtaining a current blocking layer by photolithography, then obtaining a current spreading layer by depositing, and obtaining the PN step by etching;
  (c) depositing a plurality of the at least one first P-type electrode and a plurality of the at least one first N-type electrode on a surface of a chip, wherein the plurality of the at least one first P-type electrode and the plurality of the at least one first N-type electrode are alternately distributed, and then depositing the first insulation layer;
  (d) obtaining the plurality of first through holes and the plurality of second through holes respectively above the plurality of the at least one first P-type electrode and the plurality of the at least one first N-type electrode by photolithography, depositing the second P-type electrodes at the first through holes, and depositing the second N-type electrodes at the plurality of second through holes, wherein the plurality of the at least one second P-type electrode and the plurality of the at least one second N-type electrodes are isolated from each other;
  (e) depositing the second insulation layer, and obtaining the plurality of third through holes and the plurality of fourth through holes respectively above the second P-type electrodes and the second N-type electrodes by photolithography, depositing the third P-type electrodes at the plurality of third through holes, and depositing the third N-type electrodes at the plurality of fourth through holes, wherein the third P-type electrodes and the third N-type electrodes are isolated from each other, and the second P-type electrodes extend below the third N-type electrodes; and
  (f) depositing a third insulation layer, and obtaining fifth through holes and sixth through holes respectively above the third P-type electrodes and the third N-type electrodes by photolithography, depositing the P-type pads at the fifth through holes, and depositing the N-type pads at the sixth through holes.

* * * * *